(12) United States Patent
Tokita et al.

(10) Patent No.: US 6,868,235 B2
(45) Date of Patent: Mar. 15, 2005

(54) OPTICAL TRANSMISSION MODULE WITH LIGHT ELEMENT TEMPERATURE CONTROL

(75) Inventors: Shigeru Tokita, Yokohama (JP); Tadashi Hatano, Yokohama (JP); Fumihide Maeda, Odawara (JP); Yoichi Honzawa, Yokohama (JP); Katsumi Saito, Yokohama (JP)

(73) Assignee: Opnext Japan, Inc. (JP)

( * ) Notice: Subject to any disclaimer, the term of this patent is extended or adjusted under 35 U.S.C. 154(b) by 605 days.

(21) Appl. No.: 09/946,966

(22) Filed: Sep. 4, 2001

(65) Prior Publication Data
US 2003/0011877 A1 Jan. 16, 2003

(30) Foreign Application Priority Data
Jul. 12, 2001 (JP) ......................................... 2001-211794

(51) Int. Cl.⁷ ........................ H04B 10/04; H04B 10/06; H04B 10/08
(52) U.S. Cl. ........................ 398/182; 398/202; 372/34; 250/238
(58) Field of Search ................................ 398/182, 197, 398/201; 372/34; 324/96; 250/201.1, 238

(56) References Cited
U.S. PATENT DOCUMENTS
5,602,860 A * 2/1997 Masonson .................... 372/34

FOREIGN PATENT DOCUMENTS
JP 09/326341 11/1997

* cited by examiner

Primary Examiner—M. R. Sedighian
Assistant Examiner—Nathan Curs
(74) Attorney, Agent, or Firm—Sofer & Haroun, LLP (57) ABSTRACT

An optical transmitter receiver module and an apparatus incorporating the same module are provided, which realizes the reduction of power consumption and the enlargement of the operating temperature range. As an example, an optical transmitter module is provided which comprises a light emitting element to generate a light signal, a signal processing circuit to transmit an electrical signal to the light emitting element and a voltage regulating circuit to lower a power voltage so as to supply the signal processing circuit with a constant voltage, wherein the module is further provided with a current regulating circuit to shunt a part of a current to be supplied into the voltage regulating circuit from a power source so as to generate a control current and a temperature controller to receive the control current so as to control a temperature of the light emitting element, wherein the module is further provided with a temperature detector to detect the temperature of the light emitting element and a temperature controlling circuit to control the control current according to an electrical signal output by the temperature detector.

6 Claims, 9 Drawing Sheets

(PRIOR ART)

OPTICAL TRANSMISSION MODULE WITH LIGHT ELEMENT TEMPERATURE CONTROL

BACKGROUND OF THE INVENTION

1. Field of the Invention

The present invention relates to an optical transmitter receiver module provided with a current regulating circuit to generate control current and a temperature controller to control the temperature of a light emitting or receiving element according to the control current, moreover, pertaining to an apparatus provided with the module.

2. Description of the Prior Art

Figure 7:
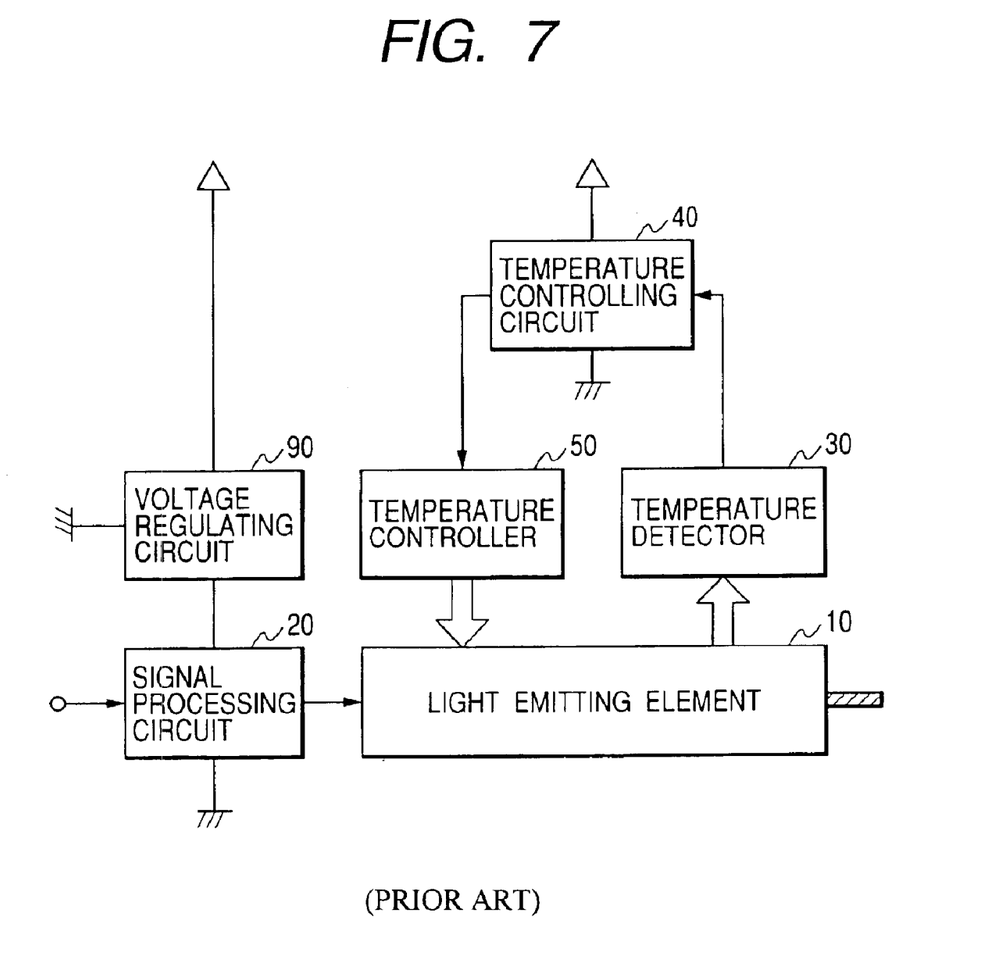
FIG. 7 shows the arrangement of the conventional optical transmitter module.

The arrangement of the conventional optical transmitter module is shown in FIG. 7 of the accompanying drawings, which module comprises a light emitting element 10, a signal processing circuit 20, a temperature detector 30, a temperature controlling circuit 40, a temperature controller 50 and a voltage regulating circuit 90. This module generates a light signal in such a manner that an electrical signal output by the signal processing circuit 20 is input to the light emitting element 10. In the meantime, in order to feed power into the processing circuit 20 according to the predetermined operating voltage, the power voltage of the optical transmitter module is subject to step-down transformation by the voltage regulating circuit 90.

Further, such module as mentioned above is disclosed in the laid open patent JP-A No. H11-163462, for instance, wherein the temperature of the light emitting element 10 is kept constant against the change of the ambient temperature by the temperature control feed-back loop comprising the temperature detector 30, the temperature controlling circuit 40 and the temperature controller 50.

However, the problem with such conventional module as above is that the provision of the feed-back loop increases power consumption. As the power consumption increases, the optical transmitter module is internally overheated, so that at the high-temperature ambient its operating temperature goes beyond the maximum rated temperature, with the result that there is the risk of the signal processing circuit 20, the temperature control feed-back loop and the light emitting element 10 malfunctioning.

Thus, the present invention is to provide an optical transmission module and an apparatus provided with the module, which reduce power consumption and extend the operating temperature range.

SUMMARY OF THE INVENTION

In order to overcome the prior issue as mentioned above, a light transmitter module is provided herein, which module comprises a light emitting element, a signal processing circuit to feed an electrical signal into the emitting element and a voltage regulating circuit to lower power voltage and to supply the processing signal with constant voltage, wherein the module is further provided with a current regulating circuit to shunt a part of current supplied into the voltage regulating circuit from power source so as to generate control current and a temperature controller subjected to control current to control the temperature of the light emitting element so as to keep it constant.

Further, an optical receiver module is provided herein, which module comprises a light receiving element to receive a light signal, a signal processing circuit to detect the electrical signal of the receiving element and a voltage regulating circuit to lower power voltage so as to feed constant voltage into the processing circuit, wherein the module is further provided with a current regulating circuit to shunt a part of the current supplied into the voltage regulating circuit from power source so as to generate control current and a temperature controller subjected to the control current to control the temperature of the light receiving element so as to keep it constant.

Moreover, an apparatus provided with the optical transmitter receiver module is provided herein, which apparatus comprises an optical transmission module, a signal processing circuit to feed an electrical signal into the module and a voltage regulating circuit to lower power voltage so as to supply the processing circuit with constant voltage, wherein the apparatus further comprises a current regulating circuit to shunt a part of the current supplied into the voltage regulating circuit from power source so as to generate control current and a temperature controller subjected to the control current to control the temperature of the module so as to keep it constant.

In the above arrangement, it should be noted that a part of the current supplied into the voltage regulating circuit from the power source is shunted so as to generate control current, which requires less power consumption than the conventional optical transmission module. The reduced power consumption constrains the module from internally overheating, so that the operating temperature range of the module and the apparatus incorporating the same further extends.

DETAILED DESCRIPTION OF THE PREFERRED EMBODIMENT

Figure 1:
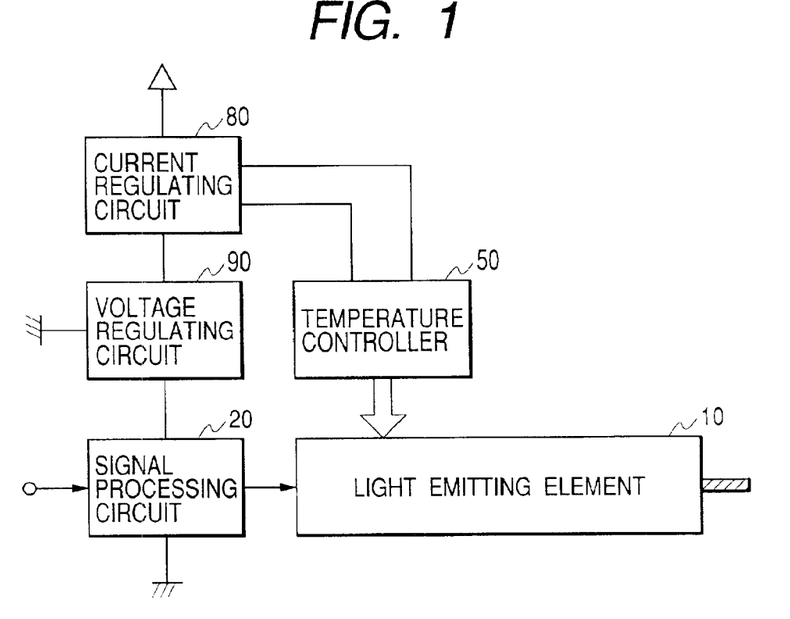
FIG. 1 shows arrangement of an optical transmitter module of a first embodiment.

A first embodiment of a light transmitting module is shown in FIG. 1, which module comprises a light emitting element 10, a signal processing circuit 20, a voltage regulating circuit 90, a current regulating circuit 80 and a temperature controller 50. In this embodiment, for the light emitting element 10 and the temperature controller 50, a semi-conductor laser diode and a current refrigeration element, respectively. For the signal processing circuit 20, a multiplexer circuit and a laser diode driving circuit are adopted herein. For the voltage regulating circuit 90 and the current regulating circuit 80, the electronic circuits as shown in FIGS. 9 and 10 are adopted herein, respectively.

Figure 9:
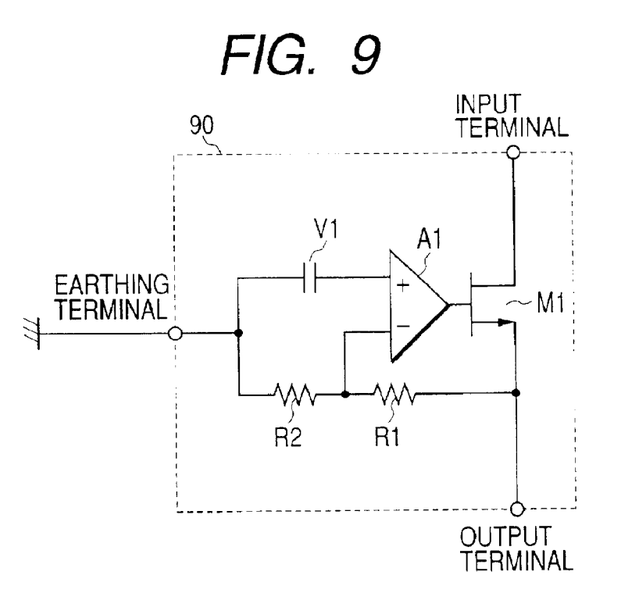
FIG. 9 shows a diagrammatic example of an electrical circuit of a voltage regulating circuit embodied in the present invention.

The electronic circuit as shown in FIG. 9, which is taken as an example of the voltage regulating circuit 90, comprises a reference voltage source V1, an amplifier A1, a FET M1 and resistance elements R1 and R2. In the same circuit, the amplifier A1 compares the voltage level at the reference voltage source V1 with that at the connecting point between the resistance elements R1 and R2 so as to control the FET, so that those voltage levels become equal, and it is controlled such that the divided potential level of the respective resistance elements R1 and R2 keeps constant, with the result that the voltage level at the output terminal is arranged to be constant.

Figure 10:
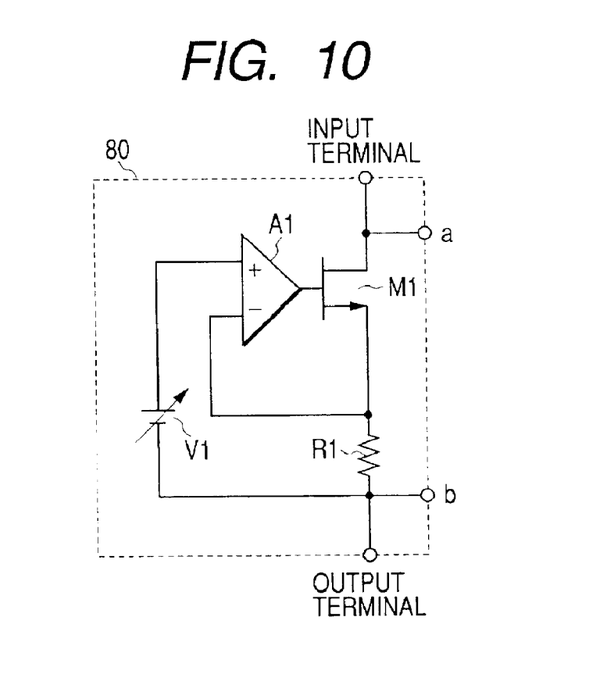
FIG. 10 shows a diagrammatic example of a first electrical circuit of a current regulating circuit embodied in the present invention.

The electronic circuit as shown in FIG. 10, which is taken as an example of the current regulating circuit 80, a variable voltage source V1, an amplifier A1, a FET M1 and a resistance element R1. In the same circuit, the amplifier A1 compares the voltage level at the variable voltage source V1 with the voltage level (step-down voltage) as generated at the respective ends of the resistance element R1 so as to control the FET, so that those voltage levels become equal. As the step-down voltage as generated at the respective ends of the resistance element R1 is controlled so as to be constant, the current through the resistance element R1 is arranged to be constant. In case that a current refrigeration element is interposed between the terminals a and b, the current though the refrigeration element is defined by the difference between the current through the output terminal and that through the resistance element R1.

The operation of the light transmitting module of the first embodiment is described below.

The light emitting element 10 generates a light ON/OFF signal according to the laser diode driving electric signal output by the signal processing circuit 20. The current regulating circuit 80 generates a control current of the temperature controller 50 by shunting a part of the power current. The light emitting element 10 is refrigerated by the temperature controller 50, and it is arranged such that its operating temperature is lower than the ambient temperature of the light transmitting module.

Figure 13A:
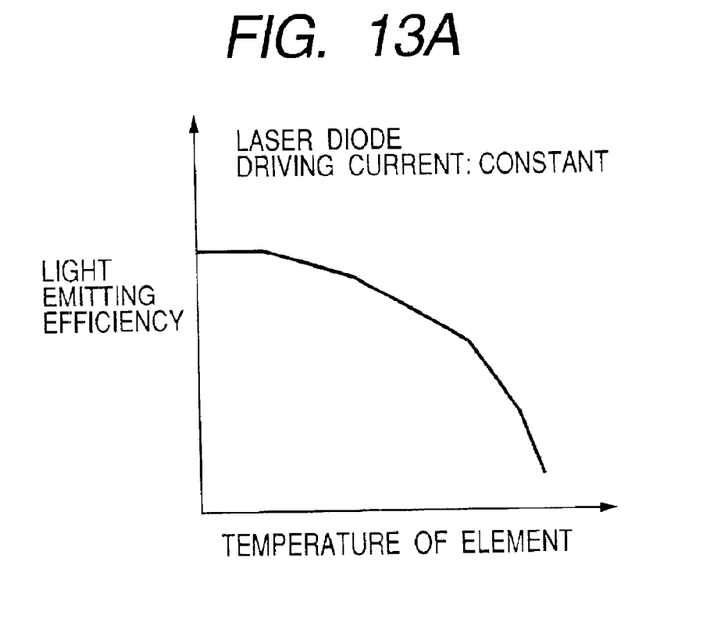
FIG. 13A is a view to show the characteristic dependency of the light emitting efficiency of the light emitting element on its own temperature, for which element a semi-conductor laser diode is adopted in this invention.

Particularly, when the semi-conductor laser diode is adopted for the light emitting element 10, the light emitting efficiency at higher temperature extremely deteriorates. FIG. 13A shows the characteristic dependency of the light emitting efficiency of the laser diode on the temperature of the element. As clearly shown in the drawing, the light emitting efficiency enhances when the temperature of the element is lower. Accordingly, the light transmitting module of the present embodiment not only restrains the light emitting efficiency of the semi-conductor laser diode from deteriorating, but also can operate at higher ambient temperature than the maximum rated operating temperature of the light emitting element 10.

Further, the light transmitting module of the present embodiment shunts a part of the power current at the current regulating circuit 80 so as to generate a control current to be supplied into the temperature controller 50. Therefore, this light transmitting module is operable with lower power consumption than the conventional module.

Figure 8A:
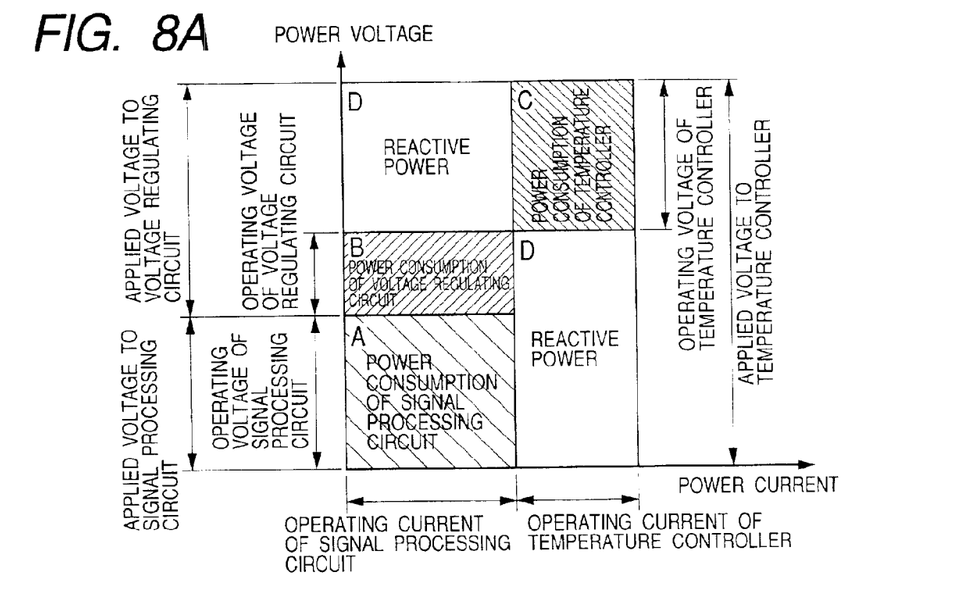
FIG. 8A is a view to show the distribution of the power consumption in the conventional optical transmitter module.

In reference to FIGS. 8A and 8B, the difference in power consumption between the conventional light transmitting module and the present module is described below. FIG. 8A indicates the distribution pattern of the power consumption of the conventional light transmitting module, in which the power voltage is supplied into the signal processing circuit and the temperature controller, respectively, so that the operating current flows separately through the processing circuit and controller. At this stage, the applied voltage is oversupplied to the voltage regulating circuit and temperature controller in comparison with the respective operating voltages. As a result of it, it is clearly understood that inutile power consumption occurs in the region D as shown in FIG. 8A.

Figure 8B:
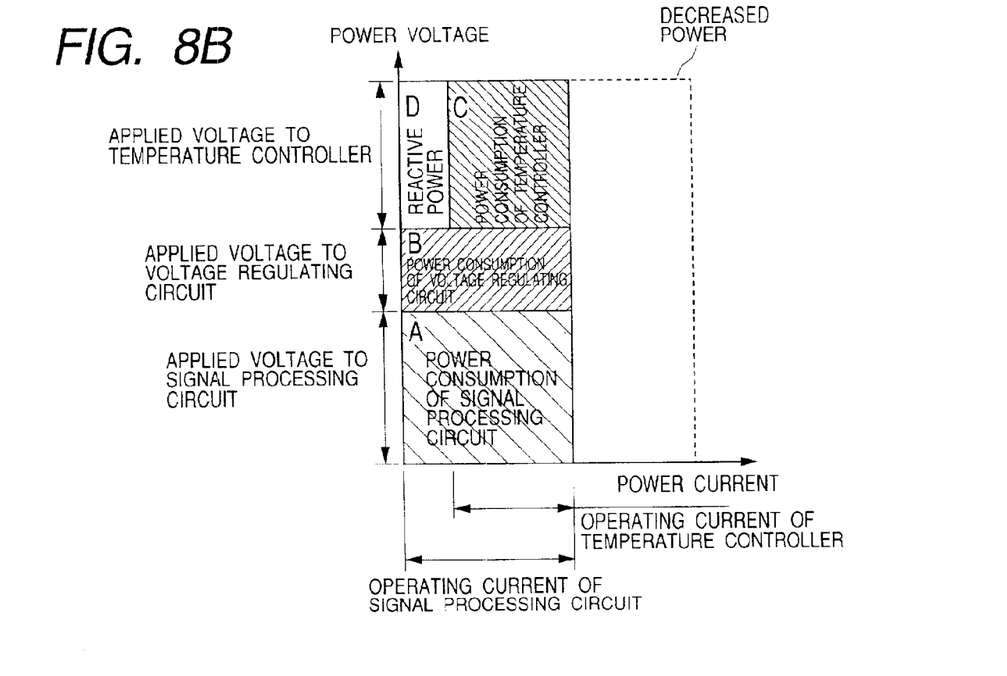
FIG. 8B is a view to show the distribution of the power consumption in the optical transmitter module of the first embodiment, respectively.

On the other hand, FIG. 8B indicates the distribution pattern of the power consumption by the light transmitting element according to the present embodiment. The present light transmitting module is arranged so that it shunts a part of the power current to be supplied into the signal processing circuit at the current regulating circuit so as to generate a control current of the temperature controller. Therefore, the present module further reduces the power current as well as power consumption in comparison with the prior art.

As mentioned above, the light transmitting module of the present embodiment reduces power consumption. As heating inside the transmitting module is restrained by the reduction of power consumption, the higher operating temperature range enlarges. To note, the semi-conductor laser diode is adopted for the light emitting element 10 in this embodiment, but it does not matter whether a laser diode module integrating a semi-conductor laser diode and a laser diode driving circuit is adopted instead. In this case, poor performance owing to the parasitic element and disturbing noise is avoidable by adjacently connecting the semi-conductor laser diode and laser diode driving circuit, and the refrigeration by the temperature controller 50 abates the deterioration of the light emitting efficiency of the semi-conductor laser diode by the heating of the laser diode driving circuit.

Figure 2:
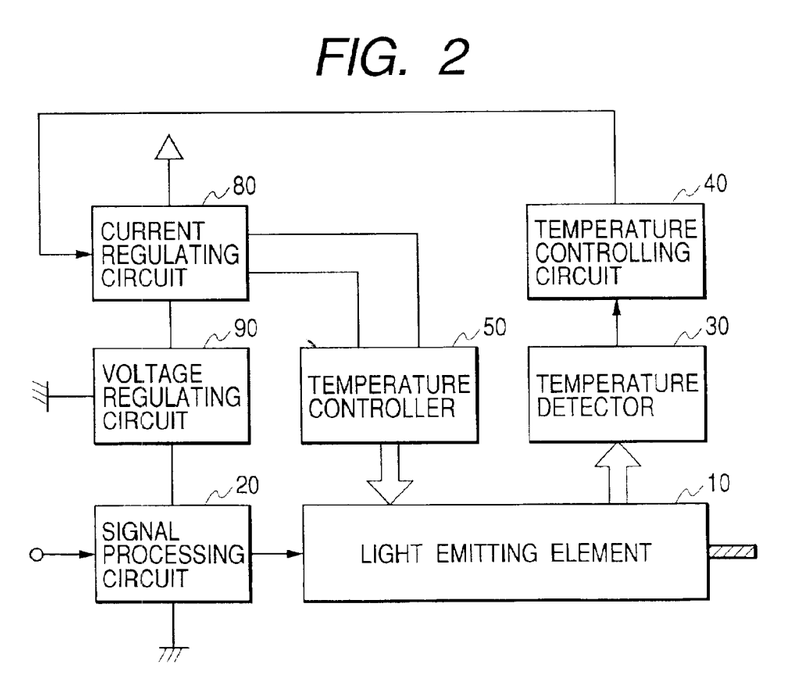
FIG. 2 shows arrangement of an optical transmitter module of a second embodiment.

Then, FIG. 2 shows a second embodiment of the light transmitting module according to the present invention. This transmitting module is characterized in being further provided with a temperature detector 30 and a temperature controlling circuit 40 besides the structural elements of the module according to the first embodiment. In this embodiment, as an example of the temperature controller 50, the Peltier element is adopted, which element alternates a heating state with a cooling state according to the polarity of the control current. As an example of the temperature detector 30, a thermistor is adopted while as an example of the current regulating circuit 80, the electronic circuit as shown in FIG. 11 is adopted.

Figure 11:
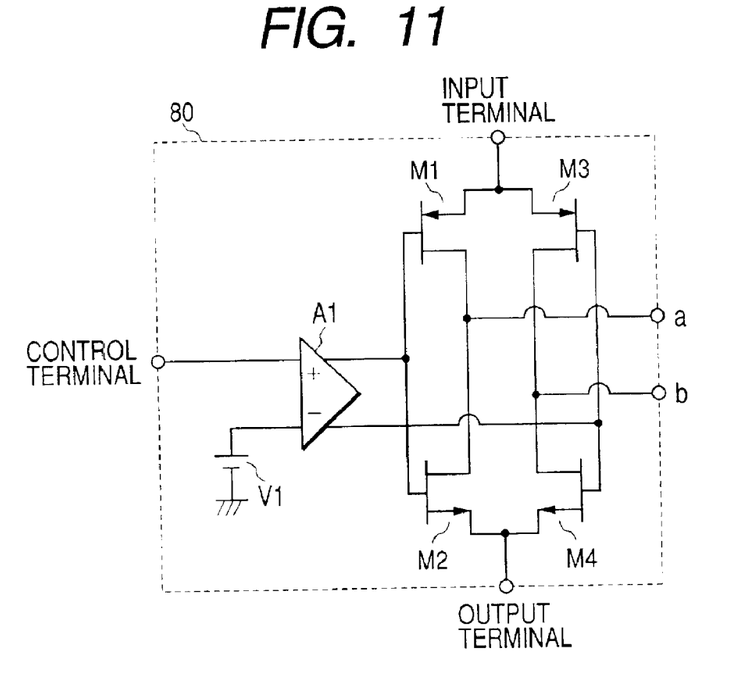
FIG. 11 shows a diagrammatic example of a second electrical circuit of the current regulating circuit embodied in the present invention.

The electronic circuit as shown in FIG. 11, which circuit is taken as an example of the current regulating circuit 80, comprises a reference voltage source V1, an amplifier A1, FETs M1, M2, M3 and M4. In the same circuit, when the voltage level imparted to a control terminal is smaller than the reference voltage V1, the FETs M1 and M4 turn on while the FETs M2 and M3 turn off, so that the electric potential at the terminal a becomes larger than that at the terminal b. As a result of it, the interposition of the Peltier element between the terminals a and b causes electric current to flow from the terminal a to the terminal b.

On the other hand, in the same electronic circuit as mentioned above, when the voltage level imparted to a control terminal is larger than the reference voltage V1, the FETs M2 and M3 turn on while the FETs M1 and M4 turn off, so that the electric potential at the terminal b becomes larger than that at the terminal a. As a result of it, the interposition of the Peltier element between the terminals a and b causes electric current to flow from the terminal b to the terminal a. That is, the electronic circuit as shown in FIG. 11 enables the control current and polarity of the Peltier element interposed between the terminals a and b to be adjusted according to the voltage level imparted to the control terminal.

The operation of the light transmitting module according to the present embodiment is described below. In this embodiment, the temperature of the light emitting element 10 is monitored by the temperature detector 30. The temperature controlling circuit 40 compares the temperature as monitored by the detector with a target temperature or a predetermined temperature, by which the light emitting element normally operates and acts on the control terminal of the current regulating circuit 80 according to an electrical signal output by the comparison result so as to put the control current under control.

Consequently, the polarity and the quantity of electric current of the control current of the current regulating circuit 80 are defined, according to which the temperature controller 50 alternates a heating state with a cooling state. When the temperature of the light emitting element 10 is higher than the target temperature or the predetermined temperature, the temperature controller 50 stays in a cooling state while staying in a heating state when the former temperature is lower than the latter temperature. The controlling operation as mentioned above keeps the temperature of the light emitting element 10 stable against the ambient temperature change of the light transmitting module.

Figure 13B:
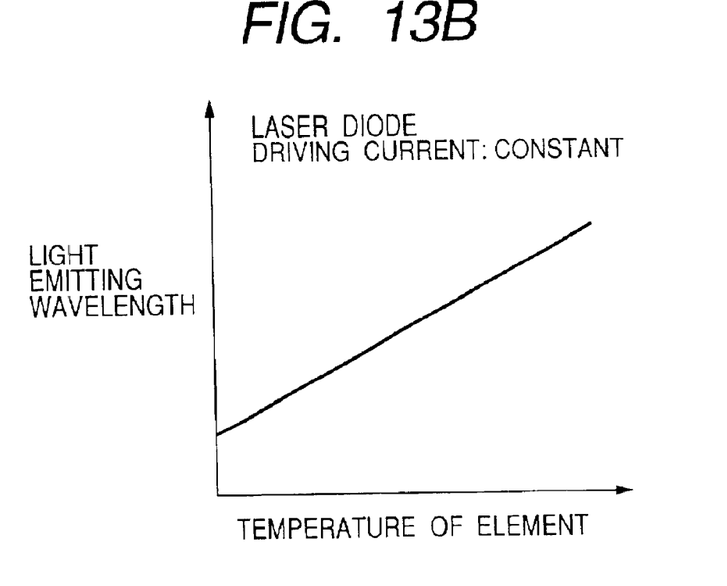
FIG. 13B is a view to show the characteristic dependency of the light emitting wavelength of the laser diode on the temperature of the element.

FIG. 13B shows the characteristic dependency of the light emitting wavelength of the semi-conductor laser diode on the temperature of the element. As shown in the drawing, the light emitting wavelength of the laser diode changes according to the change of the temperature. On the other hand, the use of the light transmitting module according to the present embodiment keeps the temperature of the light emitting element 10 stable, which prevents the wavelength from changing. The transmitting module with such high stableness in wavelength as mentioned above is especially effective for wavelength multiplex transmission (hereinafter, referred to as WDM transmission).

Further, the light transmitting module as shown in FIG. 2 utilizes a part of the power current of the signal processing circuit 20 so as to generate the control current to be supplied into the temperature controller 50, leading to lower power current and power consumption.

Figure 3:
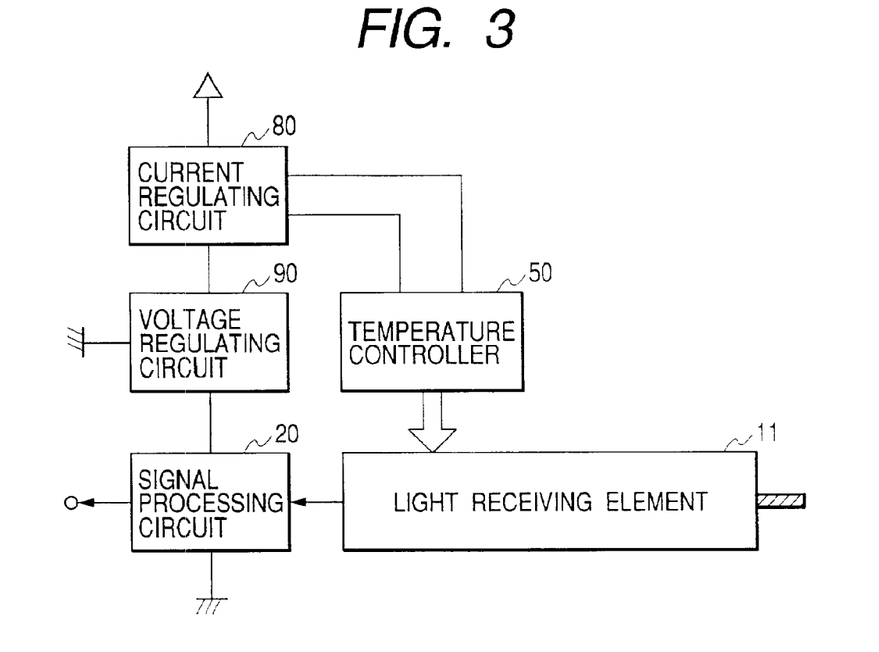
FIG. 3 shows arrangement of an optical receiver module of a third embodiment.
Figure 12:
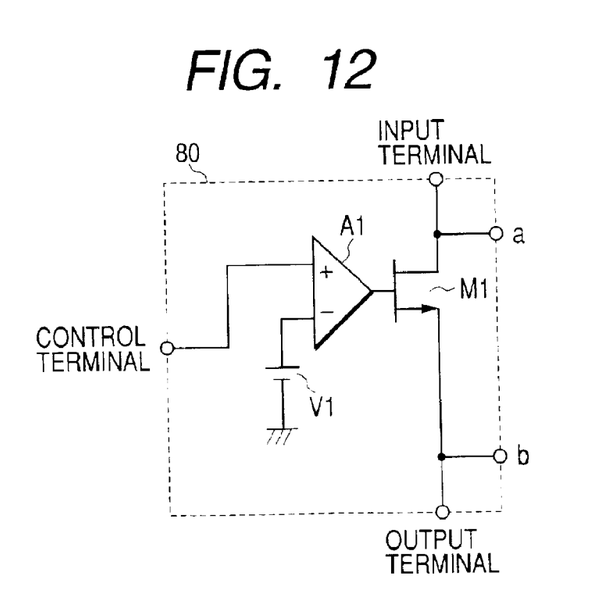
FIG. 12 shows a diagrammatic example of a third electrical circuit of the current regulating circuit embodied in the present invention.

Then, FIG. 3 shows a third embodiment of the light receiving module according to the present invention. In the drawing, the light receiving module comprises a light receiving element 11, a signal processing circuit 20, a voltage regulating circuit 90, a current regulating circuit 80 and a temperature controller 50. In this embodiment, a photodiode and a current refrigeration element are taken as an example for the light receiving element 11 and the temperature controller 50, respectively. As an example of the signal processing circuit 20, a head amplifier and a clock extraction/demultiplexer and so forth are adopted herein. The electronic circuit as shown in FIG. 12 is taken as an example for the current regulating circuit 80. Here, the head amplifier is provided with a transimpedance amplification function to convert a current signal output by the photodiode into a voltage signal.

The electronic circuit as shown in FIG. 12, taken as one example of the current regulating circuit 80, comprises a reference voltage source V1, an amplifier A1 and a FET M1. In this circuit, a current refrigeration element is connected to the respective terminals a and b. When the voltage level imparted to the control terminal is smaller than the reference voltage V1, the FET M1 turns off. Thus, electric current flows from the terminal a to the terminal b via the current refrigeration element. On the other hand, when the voltage level imparted to the control terminal is larger than the reference voltage V1, the FET M1 turns on. Thus, electric current becomes hard to flow through the current refrigeration element. That is, the electronic current as shown in FIG. 12 controls electric current flowing through the refrigeration element according to the control voltage.

The operation of the light receiving module as shown in FIG. 3 is described below. A light signal is converted into an electric signal by the light receiving element 11, which electric signal is processed by the signal processing circuit 20. The light receiving element 11 is refrigerated by the temperature controller 50, the operating temperature of which element is arranged to be lower than the ambient temperature of the light receiving module. When a photodiode is adopted for the light receiving element 11, it occurs that dark current remarkably increases at higher temperature. Here, the dark current signifies such electric current as flowing without illuminating the photodiode, which dark current plays an offset role so as to interrupt receiving a light signal by making noises. Thus, the smaller the dark current is, the better it is.

Figure 14A:
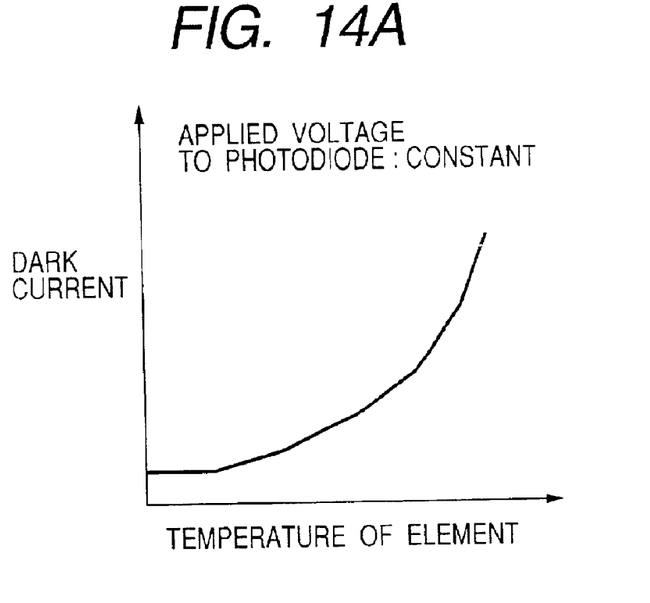
FIG. 14A is a view to show the characteristic dependency of the dark current of the light receiving element on its own temperature, for which element a photodiode is adopted in this invention.

As a result of it, noise current increases disproportionately to signal current, which deteriorates the sensitivity of the light receiving module. FIG. 14A shows the characteristic dependency of the dark current in the photodiode on the temperature of the element. As shown, as the temperature of the element rises, the dark current increase. The light receiving module according to the present embodiment restrains its receiving sensitivity from deteriorating by refrigerating the light receiving element 11 by means of the temperature controller 50 and operates at higher temperature than the maximum rated operating temperature of the light receiving element 11.

To note, a photodiode is taken as an example for the light receiving element 11 in this embodiment, but a photodiode module integrating a photodiode and a head amplifier may be adopted instead. In this case, poor performance owing to a parasitic element and disturbing noise is controlled by closely connecting the photodiode and head amplifier.

Figure 4:
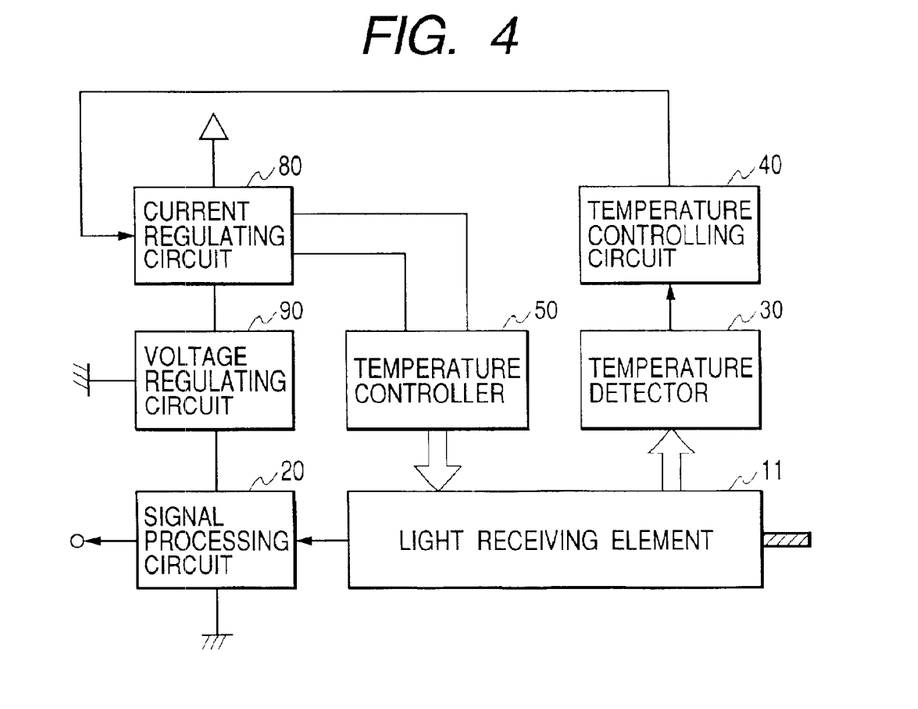
FIG. 4 shows arrangement of an optical receiver module of a fourth embodiment.

FIG. 4 shows a fourth embodiment of the light receiving module according to the present invention. This module is characterized in being further provided with a temperature detector 30 to detect the temperature of the light emitting element, a temperature controlling circuit 40 to control the control current to be output from the current regulating circuit 80 according to an electric signal output by the temperature detector besides the structural elements of the third embodiment of the light receiving module. In this embodiment, a photodiode module integrating a photodiode and a head amplifier is taken as one example for the light receiving element 11. As an example of the temperature controller 50 and the temperature detector 30, a Peltier element and a thermistor are adopted, respectively while the electronic circuit as shown in FIG. 12 is adopted for the current regulating circuit 80.

The light receiving module of the present embodiment is provided with the temperature detector 30 and temperature controlling circuit 40, so that it performs a feed-back control on the temperature of the light receiving element 11 so as to keep it constant.

Figure 14B:
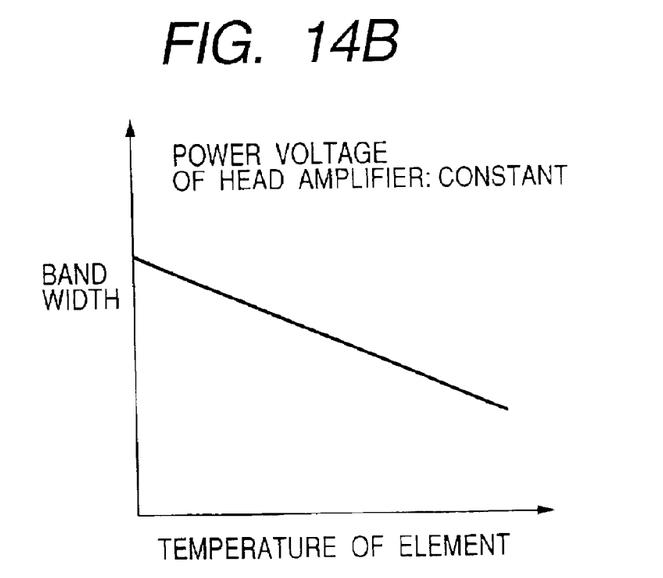
FIG. 14B is a view to show the characteristic dependency of the bandwidth of a head amplifier on the temperature of the element.

FIG. 14B shows the characteristic dependency of the band width of the head amplifier comprising a semi-conductor integrated circuit on the temperature of the light receiving element. It is clearly shown therein that the band width of such head amplifier decreases according to the temperature change of the light receiving element, which leads to the dependency of the receiving characteristics on the temperature of the same element. On the other hand, the use of the light receiving module of the present embodiment keeps the temperature of the light receiving element 11 stable so as to prevent the change of the receiving characteristics of the element and to enlarge its operating temperature range.

Figure 5:
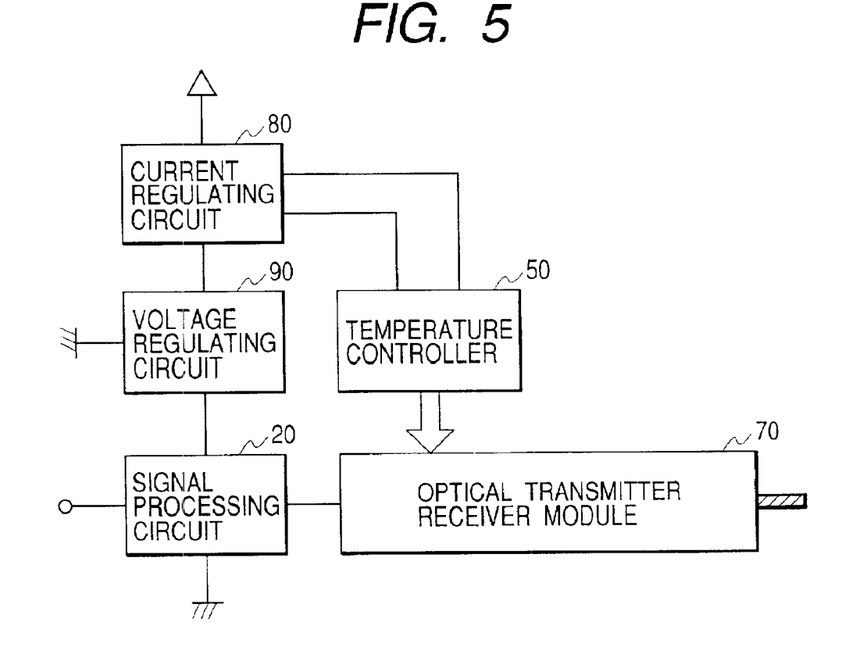
FIG. 5 shows arrangement of an apparatus incorporating an optical transmitter receiver module of a fifth embodiment.

FIG. 5 shows a fifth embodiment of the apparatus comprising an optical transmitter receiver module according to the present invention. As shown, the same apparatus comprises an optical transmitter receiver module 70 to convert an electric signal into a light signal or vice versus, a signal processing circuit 20, a voltage regulating circuit 90, a current regulating circuit 80 and a temperature controller 50. For the temperature controller 50, the above-mentioned Peltier element is adopted. The optical transmitter receiver module 70 is refrigerated by the temperature controller 50 and is arranged to operate at lower temperature than the ambient temperature of the apparatus, which enables the apparatus to operate at higher ambient temperature than the maximum rated operating temperature of the module 70.

Further, the apparatus as shown in FIG. 5 shunts a part of the power current at the current regulating circuit 80 so as to generate the control current to be supplied into the temperature controller 50, which decreases the power current required for the operation of the same apparatus and reduces power consumption. The reduction of power consumption leads to the restraint of heating inside the same apparatus so as to enhance the higher operating temperature range of the same apparatus.

To note, it does not matter whether the plurality of the optical transmitter receiver modules is adopted for the module 70, which realizes a high density and high intelligence arrangement of the same apparatus.

Figure 6:
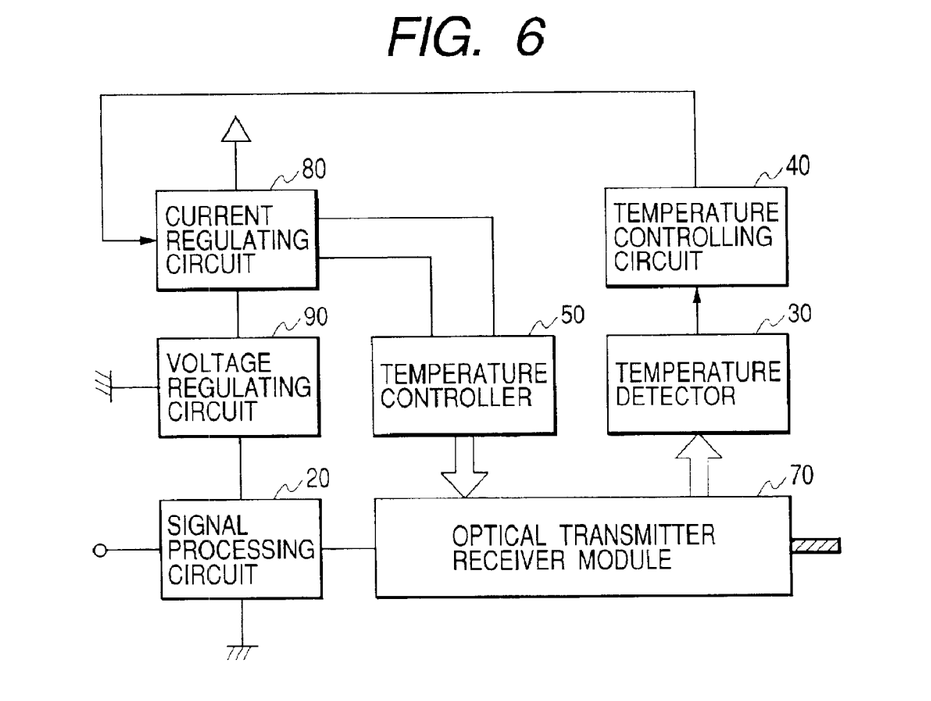
FIG. 6 shows arrangement of an apparatus incorporating an optical transmitter receiver module of a sixth embodiment.

FIG. 6 shows a sixth embodiment of an apparatus comprising the optical transmitter receiver module according to the present invention. This apparatus is characterized in being further provided with a temperature detector 30 to detect the temperature of the optical transmitter receiver module and a temperature controlling circuit 40 to control the control current output from the current regulating circuit 80 according to an electric signal output by the temperature detector besides the structural elements of the apparatus according to the fifth embodiment.

The apparatus as shown in FIG. 6 performs a feed-back operation by means of the temperature detector 30 and temperature controlling circuit 40 so as to keep the operating temperature of the optical transmitter receiver module constant, which enables the module to be stably used even if the ambient temperature has changed. As a result of it, the operating temperature range of the same apparatus enlarges.

In view of the foregoing, the optical transmitter receiver module and the apparatus comprising the module according to the present invention reduce power consumption, due to which undesired heating is restrained so as to enhance the operating temperature range thereof.

What is claimed is:

1. An optical transmitter module having a light emitting element to generate a light signal, a signal processing circuit to transmit an electric signal to the light emitting element and a voltage regulating circuit to lower a power voltage so as to supply the signal processing circuit with a constant voltage, wherein the optical transmitter module is further provided with a current regulating circuit to shunt a part of a current to be supplied into the voltage regulating circuit from a power source so as to generate a control current and a temperature controller to receive the control current so as to control a temperature of the light emitting element within a predetermined temperature.

2. An optical transmitter module according to claim 1, further comprising a temperature detector to detect the temperature of the light emitting element and a temperature controlling circuit to control the control current in response to an electric signal output from the temperature detector, wherein the predetermined temperature is defined as such temperature as making the light emitting element operate normally.

3. An optical receiver module having a light receiving element to receive a light signal, a signal processing circuit to detect an electrical signal of the light receiving element, and a voltage regulating circuit to lower a power voltage and supply the signal processing circuit with a constant voltage, wherein the optical receiver module is further provided with a current regulating circuit to shunt a part of a current to be supplied into the voltage regulating circuit from a power source so as to generate a control current and a temperature controller to receive the control current so as to control a temperature of the light receiving element within a predetermined temperature.

4. An optical receiver module according to claim 3, further comprising a temperature detector to detect a temperature of the light receiving element and a temperature controlling circuit to control the control current in response to an electric signal output from the temperature detector, wherein the predetermined temperature is defined as such temperature as making the light receiving element operate normally.

5. An apparatus for performing the transmission of an optical signal having an optical transmission module, a signal processing circuit to transmit an electrical signal to the optical transmission module and a voltage regulating circuit to lower a power voltage so as to supply the signal processing circuit with a constant voltage, wherein the apparatus is further provided with a current regulating circuit to shunt a part of a current to be supplied into the voltage regulating circuit from a power source so as to generate a control current and a temperature controller to receive the control current so as to control a temperature of the optical transmission module within a predetermined temperature.

6. An apparatus according to claim 5, further comprising a temperature detector to detect the temperature of the optical transmission module and a temperature controlling circuit to control the control current in response to an electrical signal output from the temperature detector, wherein the predetermined temperature is defined as such temperature as making the optical transmission module operate normally.

* * * * *